United States Patent [19]

Sakai

[11] Patent Number: 4,529,994
[45] Date of Patent: Jul. 16, 1985

[54] VARIABLE CAPACITOR WITH SINGLE DEPLETION LAYER

[75] Inventor: Takamasa Sakai, Tokyo, Japan
[73] Assignee: Clarion Co., Ltd., Tokyo, Japan
[21] Appl. No.: 331,575
[22] Filed: Dec. 17, 1981
[51] Int. Cl.³ ............................................. H01L 29/92
[52] U.S. Cl. ........................................ 357/14; 357/15; 357/23.6; 357/38; 357/51; 357/55
[58] Field of Search .................. 357/14, 55, 23 C, 51, 357/15, 38 P, 57, 23.6

[56] References Cited

U.S. PATENT DOCUMENTS

| 2,989,650 | 6/1961 | Doucette et al. | 357/14 X |
| 2,991,371 | 7/1961 | LeHovec | 357/14 X |
| 3,604,990 | 9/1971 | Sigsbee | 357/14 |
| 3,849,789 | 11/1974 | Corbes et al. | 357/15 |
| 3,893,146 | 7/1975 | Heeren | 357/23 C X |

FOREIGN PATENT DOCUMENTS 246465  9/1962  Australia .................. 357/14

Primary Examiner—Andrew J. James
Assistant Examiner—William A. Mintel
Attorney, Agent, or Firm—Russell E. Hattis

[57] ABSTRACT

A variable capacitor which comprises a capacity reading section including a capacity reading electrode which section is formed along a surface of a semiconductor crystal bulk having other sloping surfaces and at least one depletion layer control section including a control electrode which section is formed along the sloping surface. The thickness of a depletion layer within the bulk varies when the depletion layer control section is supplied with reverse bias voltage through the control electrode and the capacity variation then caused is read out at the capacity reading section.

7 Claims, 7 Drawing Figures

VARIABLE CAPACITOR WITH SINGLE DEPLETION LAYER

BACKGROUND OF THE INVENTION

1. Field of the Invention

This invention relates to a variable capacitor capable of obtaining smooth and moderate capacity variation.

2. Description of the Prior Art

A PN junction diode is generally used as a variable capacity diode, because, when reverse bias voltage is applied to the PN junction, carriers near the junction move so as to form a depletion layer, and the thickness of the depletion layer varies with the reverse bias voltage.

One form of such a variable capacitor diode has such a structure wherein an electrode to which bias voltage is applied also serves as the electrode for reading the capacity variation. Therefore, if a bulk having a uniform doping is used, the capacity variation characteristic is such that capacity variation is relatively moderate when a high bias voltage is applied, thus causing necessity of controlling the diffusion profile by means of ion implantation and the like. This means difficulty in producing such devices and even if the control of diffusion profile can be performed, it is only useful over a narrow range. Further, due to the above-described structure, circuit design is somewhat restricted. Additionally, with supply voltage of about 12 V, which is a standard voltage in a car, etc, the thickness of the depletion layer formed in accordance with the movement of carriers is also restricted.

SUMMARY OF THE INVENTION

The present invention has been done to solve the above-mentioned drawbacks.

In accordance with the present invention, there is provided a variable capacitor which comprises:

a semiconductor crystal bulk having at least one sloping surface;

a depletion layer control section provided on said sloping surface;

a capacity reading section provided on another surface of said bulk;

a means for applying reverse bias voltage to said depletion layer control section; and a variable voltage source for supplying said reverse bias voltage.

DETAILED DESCRIPTION OF THE PREFERRED EMBODIMENTS

Figure 1:
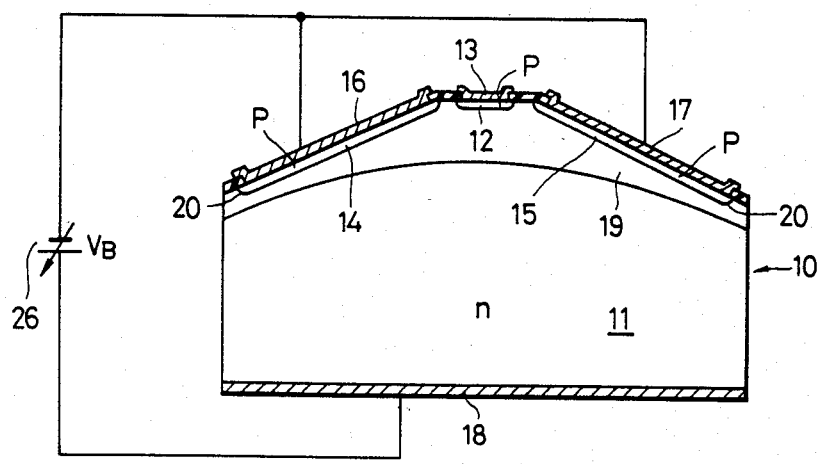
FIGS. 1 to 3 show sectional views illustrating different embodiments according to the present invention, respectively.

The present invention will now be described in detail referring to the preferred embodiments illustrated in the drawings.

FIG. 1 shows an embodiment according to the present invention, namely an actual structure of a variable capacitor 10 of a PN junction type. A semiconductor crystal bulk 11 made of an N-type material has two sloping surfaces 20 and an upper horizontal surface. In a central portion of the upper surface there is provided a P-type region 12 forming a first PN junction. A capacity reading electrode 13 made of a metallic material is provided in contact with the P-type region 12. Along both sloping surfaces 20 positioned in both sides of the P-type region 12 are provided other P-type regions 14 and 15 forming a second PN junction and a third PN junction, respectively. In contact with the respective P-type regions 14 and 15 there are provided control electrodes (bias electrodes) 16 and 17 made of a metallic material. Along the bottom of the bulk 11 an ohmic electrode 18 (opposite electrode) is formed.

With this arrangement, when reverse bias voltage $V_B$ is applied to the second and third PN junctions formed along the sloping surfaces 20 from a variable voltage source 26, the thickness of a depletion layer 19 which is formed under the first PN junction varies moderately due to the existence of the sloping surfaces 20. The capacity variation is read out at the capacity reading electrode 13. Thus, the structure as shown in FIG. 1 functions as a variable capacity diode.

Figure 2:
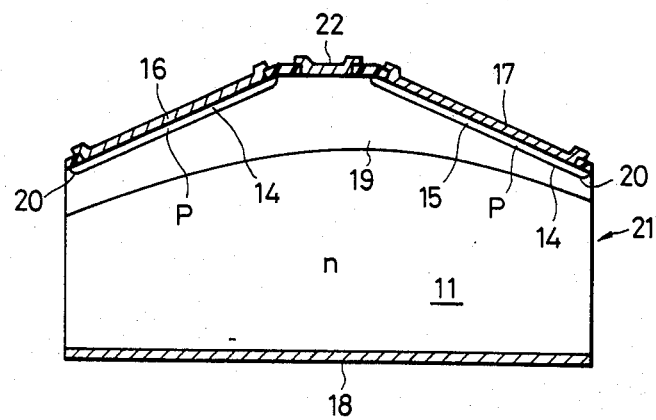

FIG. 2 shows another embodiment according to the present invention in which an actual structure of a so-called Schottky variable capacitor 21 is illustrated. Between the upper surface of the semiconductor crystal bulk 11 made of a N-type material having the sloping surfaces 20 and a capacity reading electrode 22 made of a metallic material there is formed a Schottky barrier. At both sides of the Schottky barrier and along the sloping surfaces 20 there are formed the P-type regions 14 and 15 as being the first and second PN junctions, respectively. The control electrodes ( bias electrodes) 16 and 17 made of a metallic material are provided as being in contact with the P-type regions 14 and 15, respectively. On the other hand, the ohmic electrode (opposite electrode) 18 is formed along the bottom of the bulk 11.

With this arrangement, when reverse bias voltage is applied to the first and second PN junctions formed along the sloping surfaces 20, the thickness of the depletion layer 19 then formed under the Schottky barrier varies moderately due to the presence of the sloping surfaces 20. The capacity variation then caused is read out at the capacity reading electrode 22. Thus, the structure as shown in FIG. 2 functions as a variable capacity diode, too.

Figure 3:
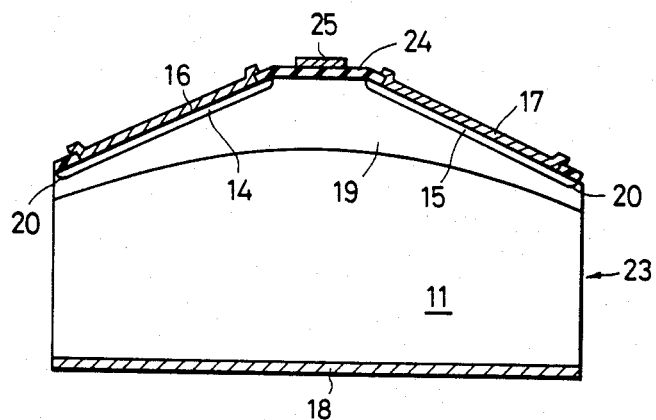

FIG. 3 shows a further embodiment according to the present invention in which an actual structure of a so-called MIS variable capacitor 23 is illustrated. The semiconductor crystal bulk 11 made of an N-type material has sloping surfaces 20 along which the first and second PN junctions 14 and 15 are formed, respectively. The control electrodes (bias electrodes) 16 and 17 made of a metallic material are provided in a manner being in contact with the P-type regions 14 and 15. Further, on the upper surface of the bulk 11 there is provided an insulator 24 spanned between the P-type regions 14 and 15. A capacity reading electrode 25 is provided on the insulator 24. That is, a MIS structure is formed on a central portion of the upper surface which is one of the surfaces of the bulk 11. On the other hand, the ohmic electrode (opposite electrode) 18 is provided along the bottom of the bulk 11.

With this arrangement, when reverse bias voltage is applied to the first and second PN junctions formed along the sloping surfaces 20, the thickness of the depletion layer 19 formed under the MIS structure moderately varies due to the presence of the sloping surfaces 20. The capacity variation then caused is read out at the capacity reading electrode 25. Thus, the structure as shown in FIG. 3 functions as a variable capacitor diode, too.

As a matter of fact, the capacitors as described above operate in the same manner even if the N-type region and the P-type region are formed to the contrary. Without being restricted to the capacity reading section, the depletion layer control section may also have a PN-junction structure, a Schottky barrier structure or a MIS structure.

Figure 4:
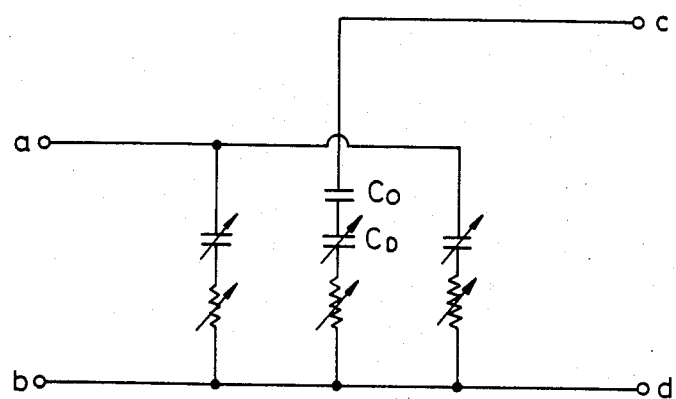
FIG. 4 shows an equivalent circuit of the embodiments as shown in FIGS. 1 to 3.

FIG. 4 shows an equivalent circuit used in each of the variable capacitors of the above-described embodiments. Terminals a and b are bias terminals for applying reverse bias voltage therethrough to the first and second PN junctions, respectively while terminals c and d are capacity reading terminals for reading variation of the capacity.

If $C_O$ denotes the differential capacity obtained when the bias voltage of the Schottky barrier is zero and when the bias voltage of the MIS structure is zero (without taking into consideration the flat band shift) and $C_D$ denotes the differential capacity obtained while the depletion layer 19 grows, the differential capacity C read out at each of the capacity reading sections (the electrodes 13, 22 and 25) is expressed as follows:

$$1/C = 1/C_O + 1/C_D \quad (1)$$

Further, when the thickness of the depletion layer is designated by d, the electrode area by S and the dielectric constant of the semiconductor crystal by $\epsilon$, respectively, the differential capacity $C_D$ of the depletion layer is expressed as follows:

$$C_D = \epsilon_s \cdot S/d \quad (2)$$

In order to design the variable capacitor so as to have a large proportional capacity variation, the capacity $C_D$ may be designed small with respect to the capacity $C_O$, as apparent from the expression (1), and the thickness of the depletion layer d may be designed large.

Conventionally, the thickness d of the depletion layer has been largely limited due to variable capacitor structures having only one electrode, which functions as a bias electrode as well as a capacity reading electrode. However, according to the present invention, in which PN junctions are provided along the sloping surfaces 20, the thickness d of the depletion layer 19 can vary in a moderate manner even when the supply voltage is around 12 V as mentioned above, and the depletion layer 19 can accordingly grow remarkably large as compared with the conventional one. Therefore, a remarkable increase of variation of the capacity then read out can be expected. Furthermore, the variable range of the capacity with respect to the voltage can appropriately be designed.

Particularly in the MIS structure as shown in FIG. 3, the capacity varying proportion $C_{max}/C_{min}$ is expressed as follows:

$$\frac{C_{max}}{C_{min}} = \frac{d}{d_0} \cdot \frac{\epsilon_0}{\epsilon_B} \left( \frac{\epsilon_s}{\epsilon_0} \cdot \frac{d_0}{d} + 1 \right) \quad (3)$$

The reference symbol $d_O$ designates the thickness of the insulator 24 and $\epsilon_O$ is the dielectric constant of the insulator 24. With this arrangement, it is easy to raise the capacity varying proportion to about 70, which is extremely large as compared with the conventional values.

Figure 5:
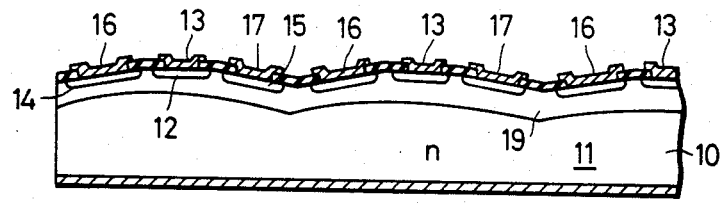
FIGS. 5 (a), (b) and (c) show sectional views and a perspective view each illustrating a further embodiment according to the present invention.
Figure 5:
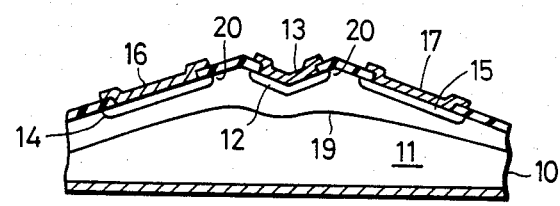
Figure 5:
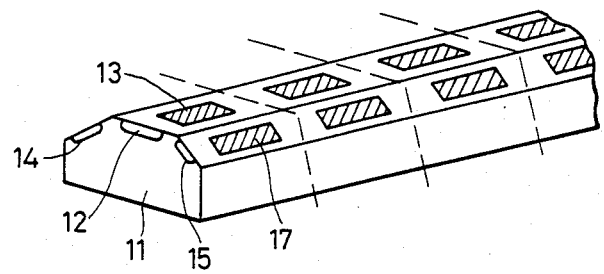

FIGS. 5 (a), (b) and (c) each illustrates a further embodiment according to the present invention. FIG. 5 (a) illustrates a structure of an IC in which a plurality of PN junction type variable capacitors are integrated in the semiconductor crystal bulk 11. The variable capacitors are in alignment thus to enable the apparatus to totally obtain a desired capacity variation characteristic. In this case, respective variable capacitors may be designed to have different capacity characteristics or to be independently used.

FIG. 5 (b) illustrates a structure of the bulk in which also the central portion of the substrate for providing the capacity reading section thereon comprises sloping surfaces 20'. Thus, since the growth of the depletion layer 19 is given a further variation, a different capacity variation characteristic can be obtained.

FIG. 5 (c) illustrates a structure of the bulk in which a plurality of the variable capacitors are provided within the semiconductor substrate bulk 11 in alignment in the longitudinal direction thereof. The bulk as constructed above may be used as shown, where the variable capacitors are connected in alignment, or otherwise, may be fabricated as individual units obtained by cutting the structure at portions indicated by dotted lines in the drawing.

The sloping surfaces in the above-described embodiments may be provided with a desired slope by well known mechanical grinding means. Furthermore, by selecting a material having a specific crystal structure and selecting an adequate chemical etching liquid to make sloping surfaces having a desired slope.

As described above, since the present invention is so arranged that the thickness of the depletion layer varies moderately due to the depletion layer control section being formed along the sloping surfaces, the depletion layer is allowed to grow large, thus enlarging the capacity variation. Incidentally, although there are provided two depletion layer control sections for applying bias voltage through the control electrodes (bias electrodes) in the above-described embodiments, the number of the depletion layer control sections may be one or more than two only if the growth of the depletion layer laying under the capacity reading section can be effectively controlled.

I claim:

1. A variable capacitor which comprises: a semiconductor body having at least one sloping surface; a capacity reading electrode provided on a surface of said body; an ohmic electrode provided on a surface of said body opposite to the surface on which said capacity reading electrode is located; and capacity producing and varying means comprising means including at least one an electrode on said at least one sloping surface, and a source of variable reverse-biasing DC voltage connected between said sloping surface electrode and said ohmic electrode for providing only a single depletion layer of adjustable thickness therebetween, the varying capacitance being obtained between said capacity reading electrode and said ohmic electrode.

2. The variable capacitor of claim 1 wherein said semiconductor body has a generally flat surface on one side thereof and over which said ohmic electrode extends, said at least one sloping surface being at the opposite side of the semiconductor body and adjoining a surface on said opposite side of said body over which said capacity reading electrode extends.

3. A variable capacitor as claimed in any one of claims 1 or 2, wherein substantially the entire semiconductor body is of a first conductivity type, and a pair of sloping surfaces are provided with electrodes thereon connected to said DC voltage source for depletion layer control, said pair of sloping surfaces sloping in opposite directions from the opposite margins of said surface on which said capacity reading electrode is located.

4. A variable capacitor as claimed in any one of claims 1 or 2, wherein substantially the entire semiconductor body is of a first conductivity type, and there is an insulating layer between said capacity reading electrode and said semiconductor body to form an MIS structure thereat.

5. A variable capacitor as claimed in any one of claims 1 or 2, wherein substantially the entire semiconductor body is of a first conductivity type, and said capacity reading electrode forms a Schottky barrier structure with said semiconductor body.

6. A variable capacitor as claimed in any one of claims 1 or 2, wherein substantially the entire semiconductor body is of a first conductivity type, and there is a doped region below said capacity reading electrode of opposite conductivity type to that of said semiconductor body to form a PN junction structure thereat.

7. A variable capacitor which comprises: a semiconductor body having a first surface on one side of said body and a second surface on the opposite side of said body and from the opposite margins of which extend oppositely sloping surfaces inclining in the direction of said first surface and terminating a substantial distance therefrom; a capacity reading electrode provided on said second surface between said oppositely sloping surfaces; an ohmic electrode provided on said first surface in contact with said body; and capacity-producing and varying means comprising means including electrodes on said sloping surfaces extending for substantially the entire extent thereof and terminating adjacent to but spaced from said surface on which said capacitor reading electrode is located, and a source of variable reverse-biasing DC voltage connected between said sloping surface electrodes and said ohmic electrode for providing a depletion layer of adjustable thickness thereat which spans the region between said sloping surfaces, the varying capacitance being obtained between said capacity reading electrode and said ohmic electrode.

* * * * *